United States Patent

Sieck et al.

[11] Patent Number: 5,616,225
[45] Date of Patent: Apr. 1, 1997

[54] USE OF MULTIPLE ANODES IN A MAGNETRON FOR IMPROVING THE UNIFORMITY OF ITS PLASMA

[75] Inventors: Peter A. Sieck, Santa Rosa; Richard Newcomb, Rio Vista; Terry A. Trumbly, Pleasant Hill; Stephen C. Schulz, Benicia, all of Calif.

[73] Assignee: The BOC Group, Inc., Murray Hill, N.J.

[21] Appl. No.: 216,633

[22] Filed: Mar. 23, 1994

[51] Int. Cl.⁶ .............................. C23C 14/54; C23C 14/34
[52] U.S. Cl. .............................. 204/298.14; 204/298.03; 204/298.06; 204/298.08; 204/298.11; 204/298.19; 204/298.21; 204/298.22; 204/298.28; 204/192.12; 204/192.13; 204/192.22
[58] Field of Search ........................ 204/298.03, 298.06, 204/298.08, 298.11, 298.14, 298.21, 298.22, 298.24, 298.28, 192.12, 192.13, 298.19, 192.22

[56] References Cited

U.S. PATENT DOCUMENTS

| | | | |
|---|---|---|---|
| 4,356,073 | 10/1982 | McKelvey | 204/298.21 |
| 4,466,877 | 8/1984 | McKelvey | 204/298.21 |
| 4,478,702 | 10/1984 | Gillery et al. | 204/298.14 |
| 4,744,880 | 5/1988 | Gillery et al. | 204/298.14 |
| 4,849,087 | 7/1989 | Meyer | 204/192.13 |
| 4,946,576 | 8/1990 | Dietrich et al. | 204/298.06 |
| 5,047,131 | 9/1991 | Wolfe et al. | 204/192.23 |
| 5,096,562 | 3/1992 | Boozenny et al. | 204/298.22 |
| 5,106,474 | 4/1992 | Dickey et al. | 204/298.06 |
| 5,108,574 | 4/1992 | Kirs et al. | 204/298.11 |
| 5,171,411 | 12/1992 | Hillendahl et al. | 204/192.12 |
| 5,234,560 | 8/1993 | Kadlec et al. | 204/298.06 |

FOREIGN PATENT DOCUMENTS

| | | |
|---|---|---|
| 4038577A1 | 6/1992 | Germany. |
| WO91/07521 | 5/1991 | WIPO. |

OTHER PUBLICATIONS

Sieck "Effects of Anode Location on Deposition Profiles for Long Rotatable Magnetrons".

*Primary Examiner*—R. Bruce Breneman
*Assistant Examiner*—Rodney G. McDonald
*Attorney, Agent, or Firm*—David A. Draegert; Salvatore P. Pace

[57] ABSTRACT

In one group of embodiments, two or more small anodes are spaced apart from one another in a magnetron, with some aspect of their electrical power being individually controlled in a manner to control a density profile across a plasma. In another group of embodiments, the same effect is obtained by mechanically moving one or more small anodes or anode masks. When used in a magnetron having either a rotating cylindrical cathode or a stationary planar cathode and designed to sputter films of material onto a substrate, the uniformity of the rate of deposition across the substrate is improved. Also, adverse effects of sputtering dielectric materials are reduced.

22 Claims, 5 Drawing Sheets

USE OF MULTIPLE ANODES IN A MAGNETRON FOR IMPROVING THE UNIFORMITY OF ITS PLASMA

BACKGROUND OF THE INVENTION

This invention is related generally to magnetrons and plasma processes, and more specifically to an application of such processes to sputter thin films of material on substrates.

There are a number of processes in various applications that involve plasma generation. An example is a dry etching process used in the fabrication of semiconductor circuits and elsewhere. Another example is the deposition of thin films onto substrates, also used in semiconductor circuit fabrication and elsewhere. A commercially important coating process uses a large magnetron to deposit thin films on large substrates such as building or auto glass wherein several layers of material are deposited in order to define certain optical characteristics of the substrate.

In this and other magnetron applications, it is highly desirable to be able to maintain control of a distribution of ions within the plasma since the ultimate product, whether from an etching, sputtering or other plasma process, is affected by this distribution. In the sputtering of thin films on large substrates, variations in the plasma density across the target cause corresponding variations in the rate of material deposition onto the substrate. Since most such applications require the deposited film to have the same thickness over the entire substrate, within a very small tolerance, other measures are taken to compensate for some non-uniformity of the plasma density but they are not always as effective as desired. Further, the plasma density profile across the target often changes during a thin film deposition or other plasma assisted process.

Therefore, it is a specific object of the present invention to provide techniques for controlling the plasma in a magnetron used for depositing films on substrates in order to result in the deposited films having uniform thickness.

It is another object of present invention provide techniques for controlling the plasma during the process of sputtering a dielectric film onto a substrate.

It is a more general object of the present invention to provide techniques for improving the level of control of various plasma processes.

SUMMARY OF THE INVENTION

These and additional objects are accomplished by the present invention, wherein, briefly and generally, one or more anodes are positioned and electrically powered in a manner to control the density profile across at least one direction of the magnetron plasma. Heretofore, relatively little attention has been paid to the role of a magnetron anode upon its plasma distribution, particularly in an application of sputtering dielectric material where that distribution changes while the process is being carried out. To implement the present invention, a single anode active surface is mechanically moved relative to the magnetron cathode during the plasma process, or multiple small anodes are fixed at separate locations and connected to independently controllable power supplies. In either case, the anodes are made to be very small in at least a direction in which the plasma density profile is to be controlled but they need to be large enough to adequately handle the amount of electrical current that they carry. The present invention allows the plasma density profile to be shaped and controlled in a manner that allows adjustments to be made during an etching, sputtering or other process being performed by a magnetron. The ability to control the profile during a process is particularly advantageous when depositing dielectric films since the anode surfaces, just as all other surfaces within the magnetron chamber, become coated with the dielectric as the process progresses.

In a preferred application of the present invention, two or more such small anodes are positioned with respect to the cathode in order to provide a plasma density profile that is as close as possible to what is desired. Electrical power to the anodes is controlled separately for each anode or groups of anodes. In one form, the relative amounts of electrical current carried by each of the anodes is controlled. In another form, two or more anodes are connected one at a time in sequence to a power source at a rate that is high enough for a given process that the substrate sees an average plasma density profile over some time. Both of these techniques permit adjusting the plasma profile in a manner that the profile can be altered during a process in order to compensate for changing conditions that occur during the process. When sputtering thin film dielectric materials, these techniques allow or provide compensation for adverse effects of the progressive coating of the anode surfaces with the dielectric material being sputtered.

Additional objects, features and advantages of the various aspects of the present invention will become apparent from the following description of its preferred embodiments which description should be taken in conjunction with the accompanying drawings.

DESCRIPTION OF THE PREFERRED EMBODIMENTS

Figure 1:
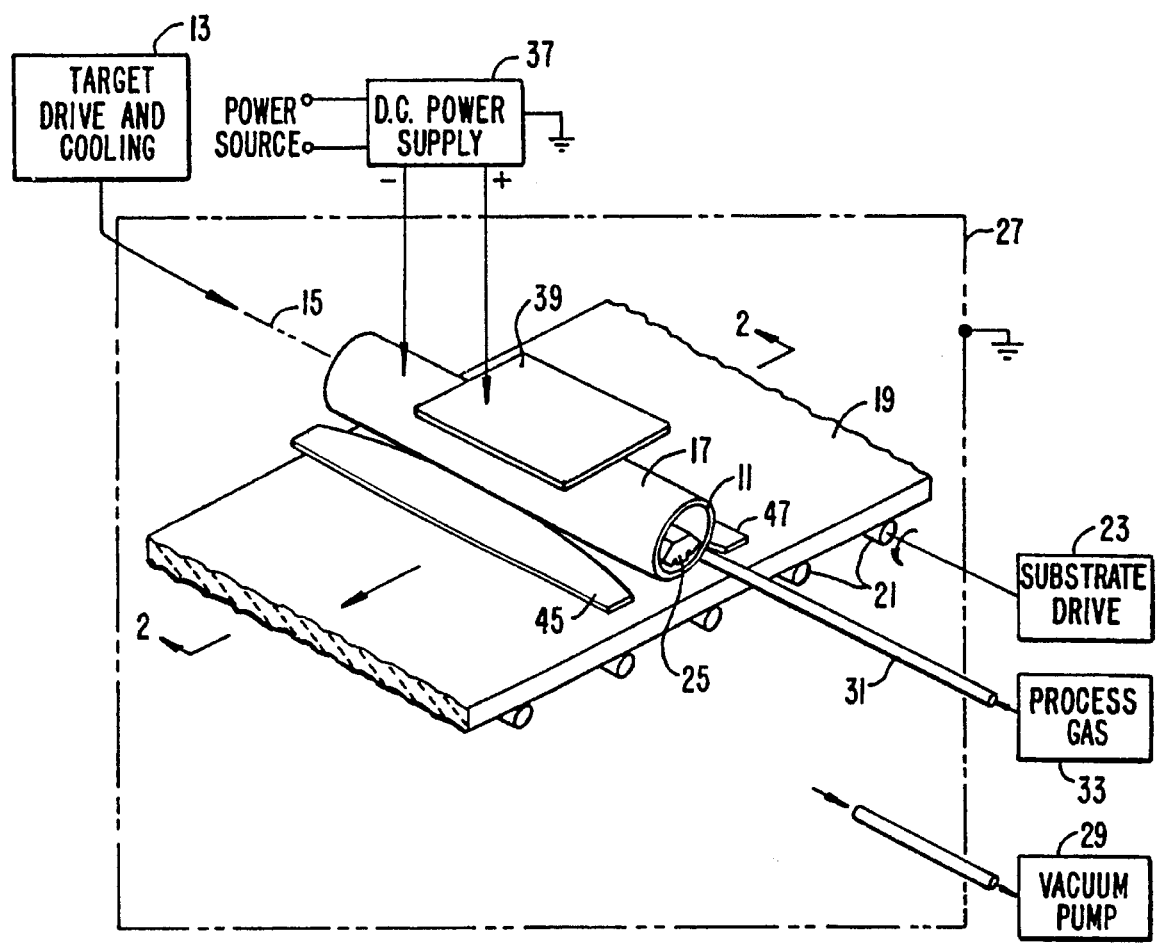
FIG. 1 schematically illustrates a thin film sputtering apparatus and process of the prior art.

Although the various aspects of the present invention have application to magnetrons and plasma processes generally, their implementation is described with respect to the figures for depositing thin films on large substrates by a sputtering process. Referring initially to FIG. 1, as a starting point, one example of such a sputtering process as currently practiced, as well as the equipment used to do so, is described. The magnetron shown in FIG. 1 is a type utilizing a cathode 11 having an elongated cylindrical shape that is rotated by an electrical motor drive source 13 at a uniform speed about an axis 15. Carried on the cylindrical outside surface of the cathode 11 is a layer of target material 17 that is sputtered away during the deposition process. A substrate 19 is moved along a path that is perpendicular to the axis 15 of rotation of the cathode 11. The substrate is moved in one direction along that path by some convenient mechanism, such as supporting rollers 21 which are driven by an electrical drive motor 23. An elongated permanent magnet structure 25 is positioned within the cathode 11 and faces toward the substrate 19 that is being coated. The magnet structure 25 does not rotate with the target 11 but its stationary position can often be rotatably adjusted somewhat. The magnet structure 25 contains magnets continuously along its length. This length determines the width of a deposition zone. The width of the substrate 19 is slightly less, as a maximum, than the length of the magnetic structure 25.

The deposition process takes place within a vacuum chamber generally formed by metallic walls, as schematically indicated by the dash line 27 of FIG. 1. A vacuum pump 29 maintains the pressure within the chamber at a low level consistent with the process being performed. Process gas is delivered adjacent the target surface 17 by a tube 31, or other form of conduit, from a supply 33. The tube 31, in one form, has holes along its length adjacent the target 17 to deliver gas directly into a deposition zone 35 (FIG. 2) between the target surface 17 and the substrate 19. A second similar gas delivery tube can be provided on an opposite side of the cathode 11. Other gas delivery techniques are also alternatively utilized.

Figure 2:
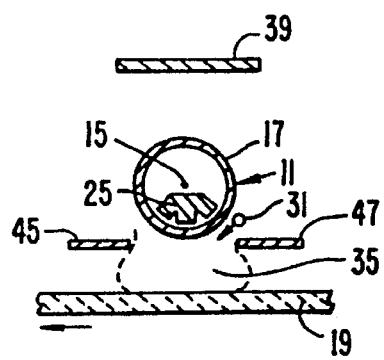
FIG. 2 is a sectional view of the sputtering apparatus shown in FIG. 1, taken at section 2—2 thereof.

The class of magnetron illustrated in FIGS. 1 and 2 is electrically powered by direct current (D.C.) power supply 37. Another class of magnetrons utilize various forms of alternating or pulsed current. The various aspects of the present invention also have applicability to that type of magnetron. But in the one illustrated in FIGS. 1 and 2, the cathode 11 is connected to a negative voltage relative to that of the chamber walls 27, which are generally maintained at ground potential. Material used for the target 17 is also made to be electrically conductive so that the outside surface of the target material is also maintained at a negative voltage.

Very often, the inside surfaces of the metallic vacuum chamber walls 27 are used as the anode for the sputtering apparatus. In this case, the walls are still maintained at ground potential. Alternatively, others utilize a separate anode 39 positioned on an opposite side of the cathode 11 from the deposition zone 35. The anode 39 is then maintained at a positive voltage by connection to the power supply 37.

In order to be able to deposit films having a uniform thickness across the width of the substrate 19, the rate of material deposition across the substrate needs to be uniform. Such a uniformity is illustrated by a solid curve 41 of FIG. 3. Such a straight line is not obtained by the deposition process itself, but rather a deposition rate profile more like that shown by the dashed curve 43 is obtained. It is common practice to modify the distribution along the length of the cathode 11 by the use of trim shields 45 and 47 on either side of the deposition zone 35. The trim shields in effect define the deposition zone 35. The shields are maintained electrically isolated from the system and are shaped to have a narrower opening in the middle portion of the length of the cathode 11, in order to restrict the rate of deposition on to the substrate 19, and to have a wider opening at either end. The use of trim shields can modify a deposition rate profile of the shape of curve 43 (FIG. 3) into something approaching the desired straight line function of the curve 41. A disadvantage, however, is that material which could be deposited on the substrate 19 is deposited on the shields 45 and 47 instead, thus reducing the potential rate in which the substrate 19 can be moved through the vacuum chamber in order to receive the desired material layer thickness.

In operation, the presence of an appropriate gas introduced through the tube 31 and negative and positive voltages applied respectively to the target 17 and anode 39, creates a plasma in the deposition zone 35 that is largely defined by the magnet structure 25 within the target 11. Another plasma is formed adjacent the anode 39, the two plasmas being linked by yet another plasma region therebetween. Free electrons and ions within the plasma within the deposition zone 35 bombard the target surface 17 to dislodge atoms from that surface. As an alternative or supplement to use of the trim shields 45 and 47, others have controlled the relative amounts of reactive gas introduced along the length of the target 17, such as by providing a greater flow at the ends of the target 17 than in its middle. Such control of the reactive gas distribution across the target can also be used to adjust, to some extent, the deposition profile across the substrate.

If the process gas introduced through the tube 31 to the deposition zone is an inert gas, then the material that is deposited on the substrate 19 is that of the target 17. It is common to deposit thin layers of metals by this technique, such as aluminum, zinc, titanium, and many others, either alone or together. The target 17 is formed of the material to be deposited plus possibly small amounts of other materials that are required to give the target 17 required mechanical characteristics.

The same general process is used to deposit dielectric films on the substrate 19, such as silicon dioxide, silicon nitride, silicon oxynitrides, aluminum oxide, titanium dioxide, and the like. In these situations, the target 17 is made of the metal component of the dielectric film and the process gas supplied through the tube 31 provides the other component. In such processes, the process gas will generally be pure oxygen, when depositing oxide films, pure nitrogen, when depositing nitride films, both oxygen and nitrogen, when depositing oxynitride films, and so forth. The gas atoms are reactively combined with metal atoms sputtered off the target 17 to provide the dielectric film. A noble gas, or combination of noble gases, may be mixed with the reactive gases.

It is the deposition of dielectric materials that creates the greatest challenges in such a process. That is because the dielectric material is not only deposited on the substrate, but also on every other surface within the vacuum chamber. This greatly effects operation of a DC magnetron during the time that the deposition occurs. It is the deposition of dielectric material on the electrically charged surfaces that is most significant. Dielectric material deposited on the target surface 17 is generally not a problem, however, since its rotation through the deposition zone 35 causes any such dielectric to be sputtered off of that surface. This is one reason why a rotating cylindrical cathode type of magnetron is favored for such processes. A planar magnetron also has dielectric material deposited over its planner cathode/target surface but it is sputtered off only in the "race track" area of the target. Other areas of the target become coated with the dielectric, eventually causing arcing which can disrupt continuation of the process.

Although a great deal of attention has been paid to overcoming this effect of dielectric material deposited on the cathode/target surface, relatively little attention has been paid to the effect of such deposition on the anode surface, the second electrically charged element of the system. The purpose of the anode is to collect electrons. In a D.C. system, the coating of the anode with dielectric material can make that very difficult. What has been discovered, as part of the present invention, is that the coating of the anode also affects the profile of the deposition rate across the width of the substrate. If the entire inside of the metal walls 27 of the vacuum chamber (without the separate anode 37 of FIG. 1) is the anode of the system, the effect is most pronounced. That large surface area is unevenly coated with the dielectric during the deposition process and this apparently results in the effective anode surface moving around within the chamber. The electrons are going to be attracted to the area or areas of this extended anode surface having the thinnest dielectric, and this location can change as the process continues.

The resulting relocation of the anode plasma around the inside of the chamber has been found to effect the density profile across the cathode plasma within the deposition zone 35. An extreme effect on that profile is illustrated by the dashed curve 49 of FIG. 3. A reshaping of the trim shields 45 and 47 is not effective to obtain the uniform profile of the curve 41 since the distribution of the curve 49 keeps changing during the process. This is caused by the effective anode surface moving around within the internal chamber walls. Use of the separate anode 39 shown in FIG. 1 reduces these variations somewhat, since the area over which the effective anode moves is much smaller, but resulting profile changes in the course of a sputtering process are still undesirable if films of uniform thickness across the substrate are required. This effect is exacerbated when the substrates are large, such as encountered with building or vehicle glass which can easily be one, two or more meters in width. The width of the deposition zone 35 thus needs to be at least as large.

According to one aspect of the present invention, this dynamic profile shift during deposition of dielectric films is eliminated by reducing the size of the effective anode surface. Referring to FIG. 4, a very small anode 51 is substituted for the larger anode 39 in the system of FIG. 1. The free electrons then have a much reduced area over which to search for the smallest dielectric film thickness. It is the dimension "D" of the anode 51 that extends in a direction parallel with the cathode axis of rotation 15 that is the most important. Since it is the deposition rate profile in that direction that is desired to be controlled, it is most important that the dimension of the anode 51 in that direction be maintained very small. Movement of the anode plasma in that direction is thus constrained, thereby eliminating the effect illustrated by the curve 49 of FIG. 3. The dimension of the anode 51 in a direction orthogonal to the axis 15 is not so important when used in the system of FIG. 1 but could be equally important if the plasma density is also desired to be controlled in that orthogonal direction.

The size of the anode 51 must be large enough, however, to handle the electrical current that it is called upon to carry. If made too small for this level of electrical current, the anode 51 will be damaged by overheating. The maximum dimension "D" that is desirable is eight centimeters, regardless of the length of the cathode 11, and preferably less than three centimeters.

Although the single small anode 51 does solve the problem of the changing deposition profile during the deposition of dielectric materials, it must necessarily be positioned about in the middle of the length of the cathode 11 in order that it does not cause the deposition profile 43 (FIG. 3) to take on some degree of asymmetry. This in turn causes the rate of deposition in the middle section along the length of the cathode 11 to increase further relative to the deposition rate toward the ends. Although the trim plates 45 and 47 can be reshaped so that the substrate 19 receives a uniform deposition rate across its width, 30 this would cause the throughput of the system to be even further reduced.

Figure 5:
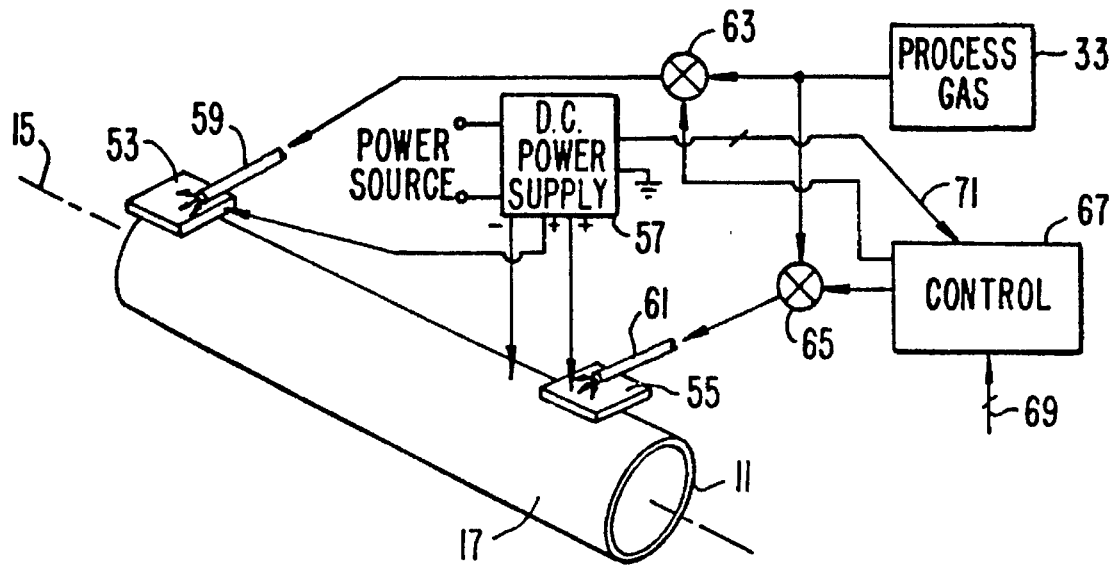
FIG. 5 shows the use of two or more small anodes with variable gas supplies, according to another aspect of the present invention.

Therefore, according to another aspect of the present invention, and as illustrated in FIG. 5, two such small anodes 53 and 55 are positioned adjacent opposite ends of the cathode 11. The power supply 57 connects the same constant voltage level to each of these anodes. The effect of this positioning is to raise the deposition rate profile at the ends of the cathode 11 while lowering it in the middle, thus making it more uniform and thus reducing the role that the trim shields 45 and 47 need to play. Circumstances can exist where it is desired to alter the deposition rate profile, even when metals are being deposited. The profile can be skewed because of the shape of the vacuum chamber and distribution of its components, effects that require a one-time adjustment. The profile can also change over time during an extended deposition process because of some parameters changing. When dielectrics are being deposited, the use of two spaced apart anode surfaces can cause significant changes in the deposition rate profile along the length of the cathode 11. The effective anode first becomes one of the two anodes 53 and 55, and then the other.

Therefore, a system shown in FIG. 5 is provided for individually controlling the level of electrical current that each of the anodes 53 and 55 may accept. This is accomplished by introducing the process gas at these anode surfaces, rather than into the deposition zone 35 as shown in FIGS. 1 and 2. Ceramic nozzles 59 and 61 are respectively positioned adjacent surfaces of the anodes 53 and 55. Gas from the source 33 is supplied to each of these nozzles through respective electrically controlled flow regulators 63 and 65. An electronic system 67 operates these valves and thus controls the relative amount of gas supplied to each of the two anodes. These amounts can be set by the user through an interface circuit 69 to maintain predetermined currents through each of the anodes 53 and 57, as fed back from the power supply 57 by a control circuit 71. If the gas flows are maintained to keep each of the two anode currents the same and constant over time, for example, the uneven build up of dielectrics on the two anodes surfaces will not cause the deposition rate profile to change. In response to sensing an imbalance in the current, the power supply 57 will cause the gas flows to be adjusted to restore the current balance, in a closed loop feedback control system. This avoids undesirable deposition rate profile changes over time. Further, the control circuit 67 can be set to intentionally operate with uneven but fixed currents through each of the two anodes 53 and 55 in order to make an adjustment to the deposition rate profile that is maintained throughout a long deposition process.

As is well known, the magnetic fields associated with the magnetron cause the electrons to move in a predetermined flow pattern around the cathode 11. The system of FIG. 5 works best if the gas nozzles 59 and 61 are positioned adjacent an edge of their respective small anodes 53 and 55 against which this electron flow is directed.

Such an introduction of the process gas is believed to control the anode currents because the gas streams create local high pressure regions adjacent the anodes. Since the anodes do not have magnets positioned adjacent them, the creation of higher pressure than the ambient pressure within the vacuum chamber is believed to promote a more intense, good anode plasma.

Figure 6:
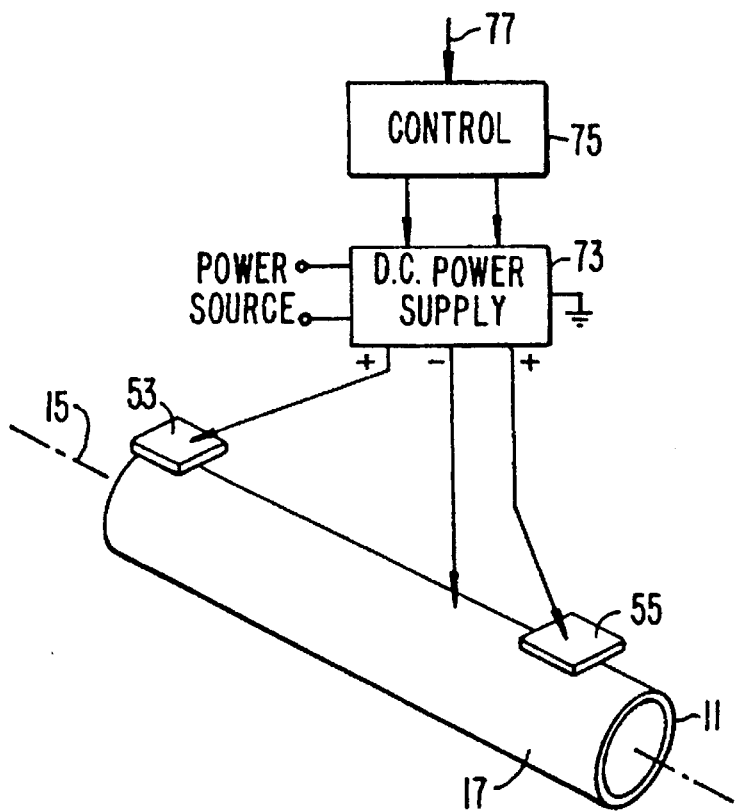
FIG. 6 shows a system having two or more small anodes that each have their electrical power independently controlled.
Figure 7:
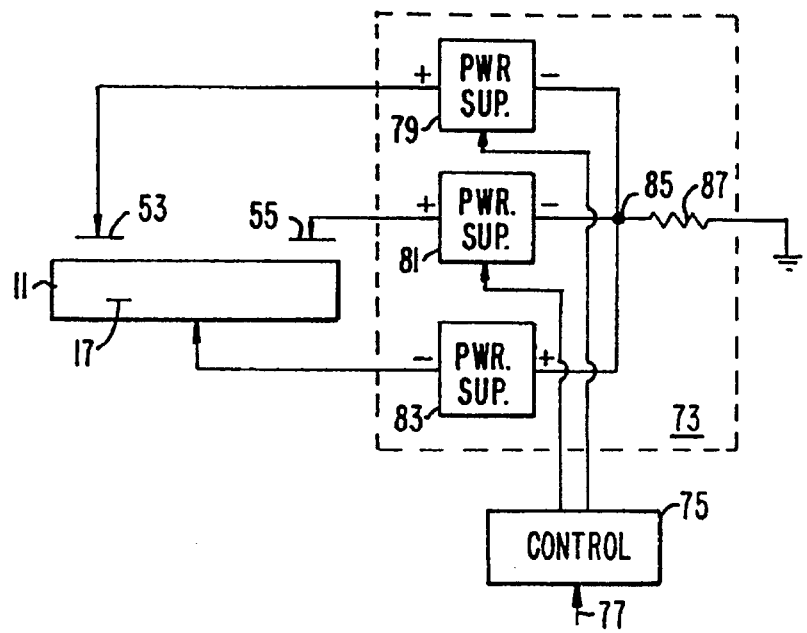
FIG. 7 is a first embodiment of the anode power control of FIG. 6.
Figure 8:
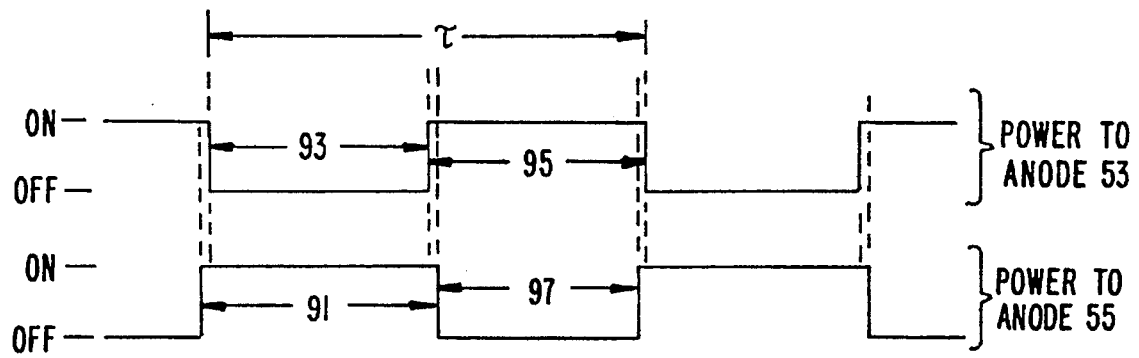
FIG. 8 is a second embodiment of the power control of FIG. 6.

Referring to FIG. 6, electrical techniques for accomplishing the same results are described that do not require the adjustable gas system of the FIG. 5 embodiment. In the embodiment of FIG. 6, processed gas is introduced to the chamber in any ordinary manner such as that shown in FIGS. 1 and 2. The same small anodes 53 and 55 are now connected to a different electrical power supply 73 which is controlled by a control system 75 under the influence of user set parameters supplied through a circuit 77. Two different embodiments of the power supply 73 are illustrated in FIG. 7 and 8. Referring first to FIG. 7, an analog system provides current to the anodes 53 and 55 from separately controlled power supplies 79 and 81, respectively. Another separate power supply 83 is connected with the cathode 11. Each of these power supplies is referenced to a common node 85 that is connected to the ground potential of the chamber walls through a resistor 87.

The desired control of the deposition profile is obtained, in one specific example, by utilizing separate constant current sources for each of the power supplies 79 and 81, where the constant level of current supplied by each is adjustable through the control unit 75. This then allows the current levels to be set to obtain a desired deposition rate profile characteristic during the process, and can even be changed during the process by adjusting the relative current levels of the power supplies 79 and 81. The use of constant current sources assures that this profile will not change during the deposition of dielectric materials since any uneven deposition on the anodes themselves is automatically compensated by the constant current capability.

Referring to FIG. 8, operation of a different type of power supply 73 (FIG. 6) is illustrated. In this embodiment, power is alternately turned "on" and "off" to each of the small anodes 53 and 55 in synchronism. The power supply is effectively switched between the two anodes. This has the advantage that, at any one instant, there is only one anode surface connected to the power supply and thus only one place for the free electrons to be collected. Therefore, this system has the advantage of the single anode system of FIG. 4 insofar as operation of the system with dielectric materials being deposited is concerned. But because two such anodes are used, this embodiment also has an advantage of being able to otherwise control the deposition rate profile.

Referring again to FIG. 8, the repetitive "on" and "off" cycles of power to the two anodes are controlled in certain ways. The anode 55 has an "on" time 91 during which the anode 53 has an "off" time 93. Conversely, in a next cycle, the anode 53 is connected to the power supply for a time 95 during which the anode 55 is turned "off" for a time 97. It will be noted that the periods during which each of the anodes is turned "on" overlaps a small amount. That is, both anodes are connected to the power supply at the time of switching from one to the other in order to assure that an anode plasma is maintained. One switching cycle has a period $\tau$. The overlap time is made to be less than one one-hundredth ($\frac{1}{100}$) of $\tau$. A typical overlap time is about one hundred microseconds.

Figure 3:
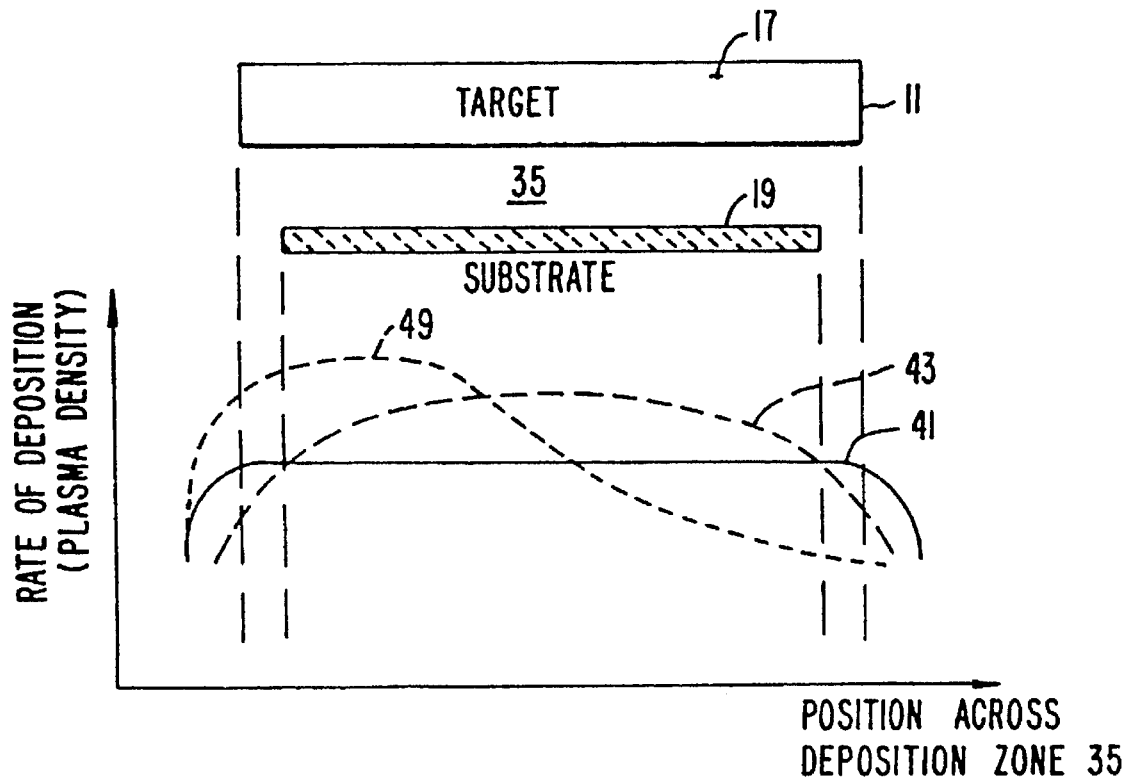
FIG. 3 illustrates by several different curves various profiles of rates of deposition across a deposition zone of the equipment shown in FIG. 1.
Figure 4:
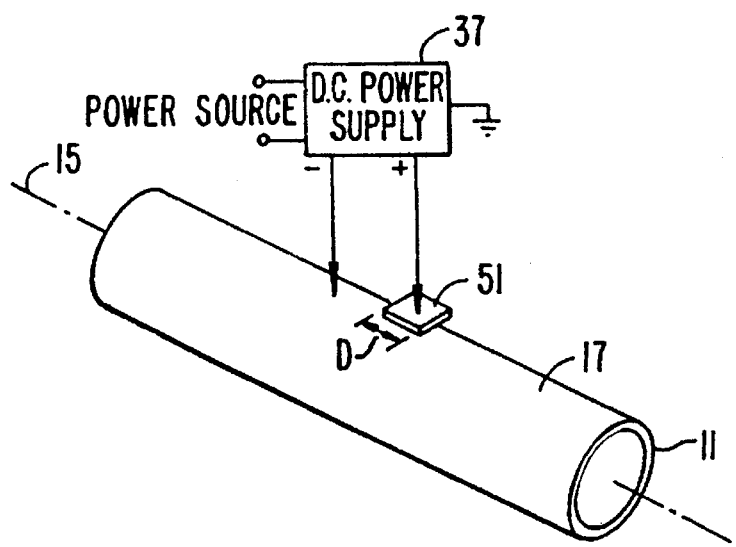
FIG. 4 illustrates the use of a single small anode, according to one aspect of the present invention.

It will be recognized that the deposition rate profile of the type shown in FIG. 3 will be quite different when one anode is energized than when the other is energized. Therefore, the switching occurs fast enough so that at least several cycles occur while any one part of the substrate is within the deposition zone. Referring to FIG. 2, it will be noted that a line across the width of the substrate, as it moves past the cathode 11, will remain in the deposition zone 35 for some time. It is desired that five or more cycles $\tau$ occur during the time it takes that line of the substrate 19 to travel through the deposition zone 35. That line then sees an average of the oscillating deposition rate profile over many cycles with the same result as when the profile remains constant during the line's traverse through the deposition zone. In practice, the frequency of the switching cycle is chosen so that 8–10 cycles $\tau$, or more, occur while any one portion of the substrate is within the deposition zone.

The time sequencing of the anodes solves the problem inherent with the deposition of dielectric materials. This technique also allows the profile characteristics of the type illustrated in FIG. 3 to be permanently modified by adjusting the relative "on" times during which each of the anodes is connected to the power supply 73. That is, rather than the "on" times 91 and 95 (FIG. 8) being the same, as illustrated, one may be shorter than the other in order to compensate for some inherent unevenness in the deposition rate profile in regions adjacent to the two anodes. Also, these relative "on" times can be adjusted during the deposition process in order to compensate for changes which occur during that process.

Although two anodes have been used as a basis of the illustrations of various aspects of the present invention with respect to FIGS. 5–8, additional anodes may be utilized. In the case of the constant current control power supply of FIG. 7, an additional constant current source is added for each of the additional anodes. In the case of the sequencing embodiment of FIG. 8, each anode is turned "on" in sequence while all others are in an "off" state, except for a small overlap of the next anode in sequence turning "on" just before the existing anode turns "off".

Figure 9:
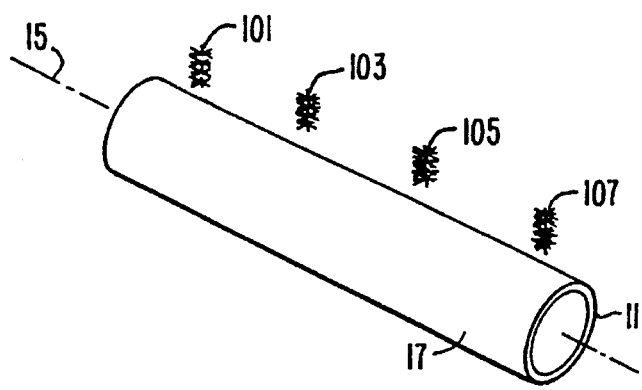
FIG. 9 illustrates a preferred type and placement of anodes to implement any of the aspect of the present invention illustrated in FIGS. 3–8.

Furthermore, the anodes need not necessarily be in a plate shaped with surfaces oriented horizontally. FIG. 9 shows the use of 4 anodes 101, 103, 105 and 107 extending along the length of the cathode 11. These anodes are each formed of a large number of wire segments extending outward from a elongated core to which they are attached, these cores being elongated in a direction perpendicular to the axis 15 of rotation of a cathode 11. The ends of these wires form a cylindrically shape having its core positioned along the axis of the cylinder. The structure and operation of such wire brush anodes are more fully provided in a copending United States patent application of Sieck et al., Ser. No. 08/086,136, filed Jul. 1, 1993, abandoned in favor of a continuing U.S. patent application Ser. No. 08/425,671 filed Apr. 18, 1995 now U.S. Pat. No. 5,487,821 the disclosure of which is incorporated herein by this reference.

Because it is a common sputtering application, the foregoing description has assumed that a uniform deposition rate is to be maintained. Material is then deposited onto a flat substrate surface in a layer having a uniform thickness thereacross. However, there are applications where some variation in the deposited layer thickness is desired. The anode control techniques of the present invention make it easier to deposit layers having some predefined thickness gradient across the width of the substrate. The deposition rate profile is controlled through adjustment of the separate anode characteristics to have a non-uniform but controlled deposition rate profile. There are also applications where the substrate is not flat, an automobile windshield being an example. Part of the windshield surface being coated curls upward toward the cathode and can even extend substantially straight up. In this case, the deposition profile is intentionally made non-uniform in order to obtain uniform thickness layers over all of the substrate.

In each of the embodiments described above, the anodes are positioned above the substrate being coated. Any particles which are dislodged from the anodes during the deposition process are blocked from reaching the substrate by positioning a basket or other barrier under each anode. This is a widely used technique, so such barriers have not been shown in the drawings. Alternatively, the components of the magnetron may be inverted; that is, the substrate can be positioned above the cathode/target and the anodes below it. Particles dislodged from the anodes then fall away from the substrate.

Figure 10:
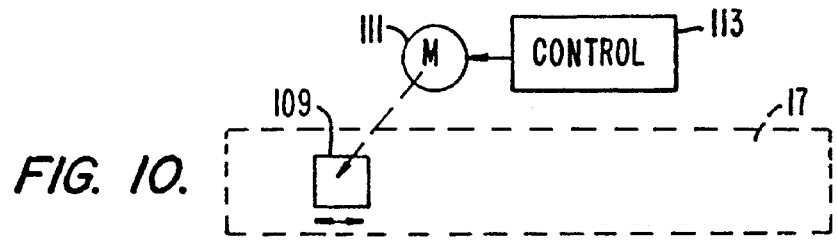
FIG. 10 schematically shows a mechanical technique that moves a single small anode during the deposition process.

Although not preferred, the same beneficial results as described above may be obtained by one of several mechanical systems. Referring to FIG. 10, a small anode 109 is moved back and forth along the length of the target 17' by a motor source 111 under control of appropriate electronic circuits 113. The use of the single small anode has the advantages described above with respect to the embodiment of FIG. 4 insofar as the deposition of a dielectric material is concerned. The deposition rate profile of the type shown in FIG. 3 is adjustable by varying the velocity profile of movement of the anode 109 along this path. For example, the anode 109 can remain for a longer proportion of time at the ends of the target 17' than it remains in the middle. The anode would be moved much faster through the central portion of its traverse than through the end of its traverse" therefor. At least five or more cycles, preferably 8–10 or more, occur during the time it takes for any line across the width of the substrate to pass through the deposition zone.

Figure 11:
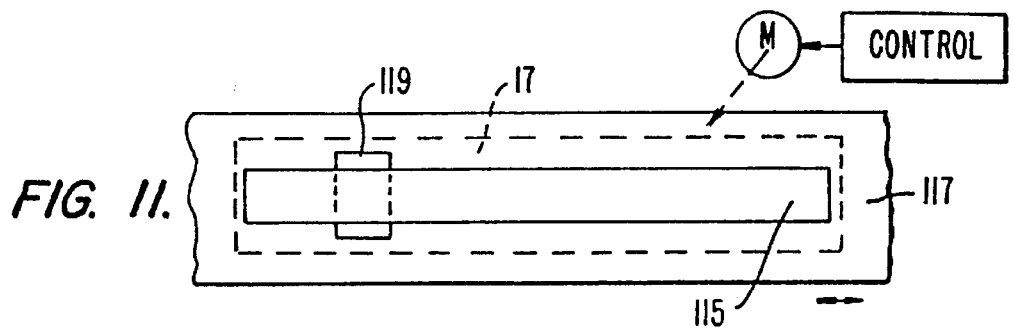
FIG. 11 shows an alternative technique of scanning a mask with a small aperture across an elongated anode during the deposition process.

FIG. 11 shows a similar system, except, instead of moving a small anode back and forth, an elongated anode 115 is positioned along the length of the target 17 and a mask 117, having an aperture 119, is moved back and forth along the length of the anode 115. The dimension of the aperture 119 in the direction of the length of the anode 115 is made to have the same small dimension "D" as described for the single anode 51 in the embodiment of FIG. 4.

Figure 12:
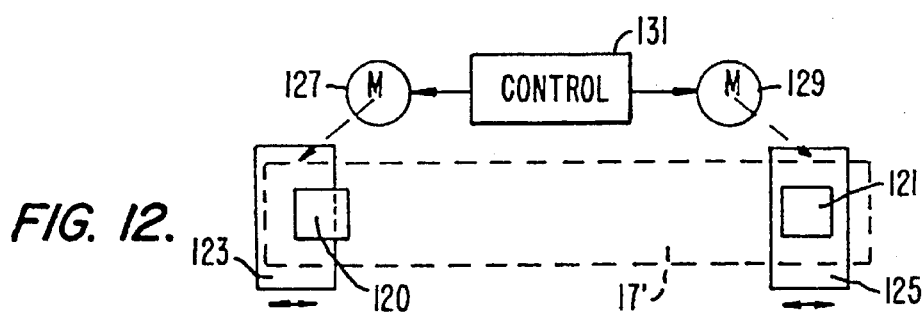
FIG. 12 shows the use of electrically controlled mechanical shutters over the surfaces of two or more small anodes.

In FIG. 12, two small anodes 119 and 121 are held fixed with respect to the length of the target 17'. However, each is provided with an operable shutter positioned between the anode and the target surface 17', shutters 123 and 125 being respectively shown. Respective motor sources 127 and 129, under the control of electronic circuits 131, move the shutters 123 and 125 individually. The shutters 123 and 125 may be positioned completely over their respective anodes 119 and 121, may be moved completely out of the way, or may be maintained somewhere in between. If each of the shutters 123 and 125 exposes a portion of its respective anodes so that the currents of the two anodes are maintained constant, the system of FIG. 12 becomes a mechanical analog of that described with respect to FIGS. 6 and 7. On the other hand, if the shutters 123 and 125 are operated in sequence so that only one of the anodes is exposed at a time (except for a small overlap where one closes shortly after the other opens), a mechanical analog of the system described with respect to FIGS. 6 and 8 is the result.

Even though the various embodiments are described above as being implemented in a system having a single rotating cylindrical cathode and target assembly, the invention can be applied to other configurations. Some sputtering systems, for example, use two or more cylindrical targets within a single vacuum chamber, their axis of rotation being oriented parallel to each other. In such a case, each of the cylindrical cathodes may be provided with a duplicate of the anode structure of one of the embodiments described, the power supplies and control systems being common to both cylindrical targets. Alternatively, two or more rotating cylindrical cathodes can share a single anode system.

Figure 13A:
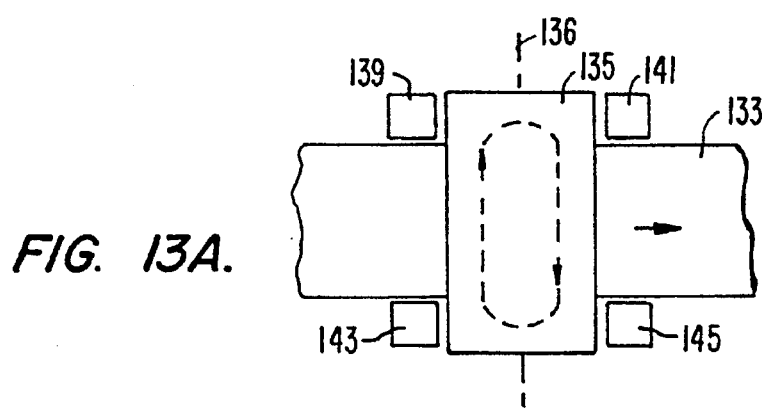
FIG. 13A is a top view of a planar magnetron utilizing multiple small anodes according to the present invention.
Figure 13B:
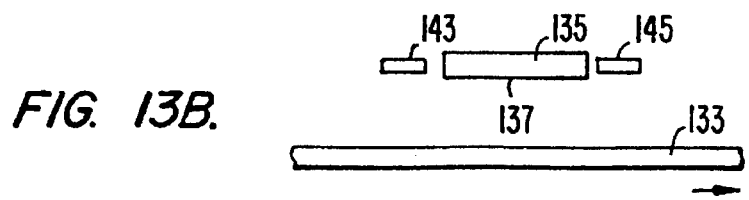
FIG. 13B is a side view of the planar magnetron of FIG. 13A.

The present invention, further, is not limited to cylindrical magnetrons. It can also be applied to a planar magnetron, an example being schematically illustrated in FIGS. 13A and 13B. A substrate 133 to be coated is moved past a cathode 135 having a planar target surface 137 parallel to that of the substrate 133. The target 137 is symmetrical about an axis 136 extending across the width of the substrate 133. Separate small anodes 139, 141, 143 and 145 are provided adjacent the corners of the cathode 135. These anodes can be operated according to any one of the embodiments described with respect to FIGS. 5–8. Alternatively, only two anodes are used, being positioned at diagonally opposite corners of the cathode 135.

Although the various aspects of the invention have been described with respect to their preferred embodiments, it will be understood that the invention is entitled to the full protection of the appended claims.

It is claimed:

1. Apparatus within a vacuum chamber for applying a thin film of a material onto a substrate that is being moved in a path therethrough, comprising:

a cylindrically shaped target that is rotatable about an elongated axis thereof which is oriented to extend transversely across said substrate path; including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including at least one anode disposed adjacent the target surface, connected to a positive voltage from a power source, and having a dimension in a direction of the target surface elongated axis of eight centimeters or less.

2. Apparatus within a vacuum chamber for sputtering a thin film of a material onto a substrate that is being moved in a path therethrough, comprising:.

a cylindrically shaped target that is rotatable about an elongated axis thereof which is oriented to extend transversely across said substrate path, including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including at least one anode disposed adjacent the target surface and connected to a positive voltage from a power source and means for physically moving said at least one anode in a direction of said target surface elongated axis.

3. Apparatus within a vacuum chamber for sputtering a thin film of a material onto a substrate that is being moved in a path therethrough, comprising:

a cylindrically shaped target that is rotatable about an elongated axis thereof which is oriented to extend transversely across said substrate path, including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including at least one anode disposed adjacent the target surface and connecting to a positive voltage from a power source, at least one shutter positioned to shield said at least one anode, and means responsive to a control signal for adjusting an amount of said anode that is covered by said shutter.

4. Apparatus within a vacuum chamber for sputtering a thin film of a material onto a substrate that is being moved in a path therethrough, comprising:

a cylindrically shaped target that is rotatable about an elongated axis thereof which is oriented to extend transversly across said substrate path, including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including at least one anode disposed adjacent the target surface and connected to a positive voltage from a power source, a mask positioned over said at least on anode, said mask having an aperture therein that is significantly smaller in a direction of said target surface elongated axis than a dimension of said anode in said direction, and means responsive to a control signal for physically moving said mask and aperture across said at least one anode in the direction of said target surface elongated axis.

5. Apparatus within a vacuum chamber for sputtering a thin film onto a substrate that is being moved in a path therethrough, comprising:

a cylindrically shaped target that is rotatable about an elongated axis thereof which is oriented to extend transversely across said substrate path, including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including two or more separate anodes disposed adjacent the target surface, fixedly positioned apart from each other in a direction of said target surface elongated axis, and connected to a positive voltage from a power source, and means responsive to control signals for physically covering each of the two or ore separate anodes in time sequence so that only one anode is exposed at substantially all times.

6. Apparatus within a vacuum chamber for sputtering a thin film of a material onto a substrate that is being moved in a path therethrough, comprising:

a cylindrically shaped target that is rotatable about an elongated axis thereof which is oriented to extend transversly across said substrate path, including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including two or more separate anodes disposed adjacent the target surface, fixedly positioned apart from each other in a direction of said target surface elongated axis, and connected to a positive voltage from a power source, and means for separately controlling power applied to the individual anodes which interconnect said anodes with said power source, said separate power controlling means including means for sequentially connecting individual ones of said two or more anodes to the power source so that only one anode is so connected at substantially all times.

7. Apparatus of claim 6 wherein said separate power controlling means includes means for adjusting the relative times that each of said two or more anodes are connected to the power source.

8. Apparatus of claim 6 wherein said separate power controlling means includes means for alternately connecting each of said two or more anodes to the power source at a rate sufficient for each of said anodes to be so connected at least five times while a given location of the substrate is passing through the deposition zone.

9. Apparatus within a vacuum chamber for sputtering a thin film of a material onto a substrate that is being moved in a path therethrough, comprising:

a cylindrically shaped target that is rotatable about an elongated axis thereof which is oriented to extend transversely across said substrate path, including magnets therein facing said path, said target having a surface which is maintained at a negative voltage, thereby defining a deposition zone between the target and substrate path that extends along a length of the cylindrical target, and means for adjusting a profile across said deposition zone of a rate of deposition of the material onto the substrate, said deposition rate profile adjusting means including two or more separate anodes disposed adjacent the target surface, fixedly positioned apart from each other in a direction of said target surface elongated axis, and connected to a positive voltage from a power source, and means for separately adjusting an electrical current through individual ones of said two or more anodes to maintain a selected level of electrical current through each one of said two or more anodes, wherein said electrical current adjusting means includes an adjustable shutter adjacent a surface of each of said two or more anodes.

10. Apparatus within a vacuum chamber, comprising:

a cathode, at least two anodes spaced apart from each other and held fixed with respect to the cathode, a source of gas introduced into the chamber sufficient to support a plasma therewithin, and means for operating said at least two anodes sequentially in time.

11. Apparatus of claim 10, wherein said operating means includes means for altering the relative times of operation of individual ones of said at least two anodes.

12. A method of controlling a distribution of a plasma generated adjacent a cathode, comprising:

positioning at least two spaced apart anodes at different locations with respect to the cathode, said anodes having an effective dimension in at least one direction of eight centimeters or less, and separately controlling electrical power to individual ones of said at least two anodes, thereby to control the distribution of the plasma, said separately controlling electrical power including energizing individual ones of said at least two anodes in time sequence.

13. A method of sputtering a dielectric film onto a substrate from a target connected to a negative voltage source and positioned within a vacuum chamber into which a reactive gas is introduced, wherein relative motion is provided between the target and substrate in one direction with the target extending across said substrate in a direction transverse to said one direction, characterized by moving an effective position of an anode at a positive voltage back and forth in said transverse direction between at least first and second positions at least five times while a given location of the substrate is within a deposition zone adjacent said cathode.

14. The method of claim 13 wherein first and second anodes are held fixed at said first and second positions and said effective movement is accomplished by controlling a connection of electrical power thereto.

15. The apparatus of claim 10 further comprising a magnet structure that forms a magnetron for sputtering a thin film of material onto a substrate being moved in a path through a vacuum chamber, wherein the cathode has a target surface that is symmetrical about an elongated axis thereof which is oriented to extend transversely across said substrate path, and the anodes are spaced apart in a direction of said target surface elongated axis.

16. The apparatus of claim 15, wherein the target surface is a cylindrically shaped surface that is rotatable about the elongated axis thereof.

17. The apparatus of claim 15 wherein the target surface is a planar surface.

18. The apparatus of claim 15 wherein said operating means includes means for altering relative times of operation of individual ones of said at least two anodes.

19. The apparatus of claim 15 further comprising means for separately adjusting electrical current through individual ones of said two or more anodes.

20. The apparatus of claim 15 further comprising means for inserting the gas in controlled amounts adjacent individual ones of said at least two anodes.

21. The apparatus of claim 15 wherein the target surface is a metal and the gas a reactive gas capable of combining with the metal to form a dielectric film on the substrate.

22. The apparatus of claim 16, wherein the target surface is a metal and the gas is a reactive gas capable of combining with the metal to form a dielectric film on the substrate.

* * * * *